US012565707B2

(12) United States Patent
Cho et al.

(10) Patent No.: US 12,565,707 B2
(45) Date of Patent: Mar. 3, 2026

(54) FABRIC-TYPE TITANIUM OXIDE-BASED POROUS WATER ELECTROLYSIS ELECTRODE AND METHOD FOR MANUFACTURING THE SAME, AND WATER ELECTROLYSIS DEVICE COMPRISING THE SAME

(71) Applicant: KOREA UNIVERSITY RESEARCH AND BUSINESS FOUNDATION, Seoul (KR)

(72) Inventors: Jinhan Cho, Seoul (KR); Jeongmin Mo, Seoul (KR); Youn Ji Ko, Gunpo-si (KR); Wondo Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 9 days.

(21) Appl. No.: 18/655,528

(22) Filed: May 6, 2024

(65) Prior Publication Data

US 2024/0368782 A1 Nov. 7, 2024

(30) Foreign Application Priority Data

May 4, 2023 (KR) ........................ 10-2023-0058305

(51) Int. Cl.
| | |
|---|---|
| *C25B 11/053* | (2021.01) |
| *C23C 14/20* | (2006.01) |
| *C25B 1/04* | (2021.01) |
| *C25B 11/056* | (2021.01) |
| *C25B 11/069* | (2021.01) |
| *C25B 11/093* | (2021.01) |
| *C25B 11/095* | (2021.01) |
| *C25B 11/097* | (2021.01) |
| *C25D 3/12* | (2006.01) |
| *C25D 7/00* | (2006.01) |

(52) U.S. Cl.
CPC .......... *C25B 11/053* (2021.01); *C23C 14/205* (2013.01); *C25B 1/04* (2013.01); *C25B 11/056* (2021.01); *C25B 11/069* (2021.01); *C25B 11/093* (2021.01); *C25B 11/095* (2021.01); *C25B 11/097* (2021.01); *C25D 3/12* (2013.01); *C25D 7/00* (2013.01)

(58) Field of Classification Search
None
See application file for complete search history.

(56) References Cited

U.S. PATENT DOCUMENTS

2023/0037147 A1* 2/2023 Son .................... C23C 14/0623

OTHER PUBLICATIONS

Hejizi et al. "Aminated TiO2 nanotubes as a photoelectrochemical water splitting photoanode", Catalysis Today 281 (2017) 189-197 (Year: 2017).*

* cited by examiner

*Primary Examiner* — Wojciech Haske
(74) *Attorney, Agent, or Firm* — NSIP Law

(57) ABSTRACT

The present invention relates to a fabric-type titanium oxide (TiOx)-based porous water electrolysis electrode, a method for preparing the same, and a water electrolysis device comprising the same.

14 Claims, 7 Drawing Sheets

【FIG. 1】
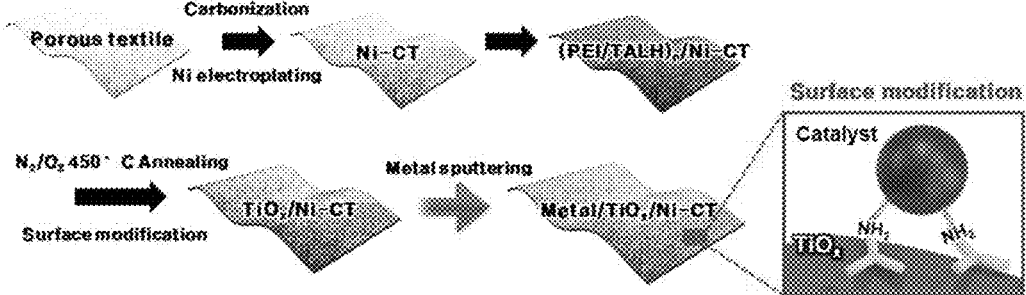
【FIG. 2】
- Cotton Fiber
- Carbonized fiber
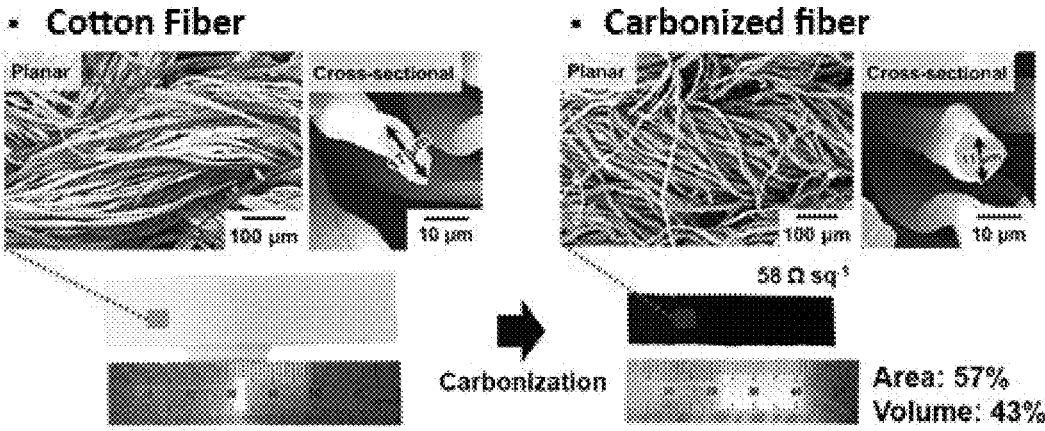
【FIG. 3】
- electroplating
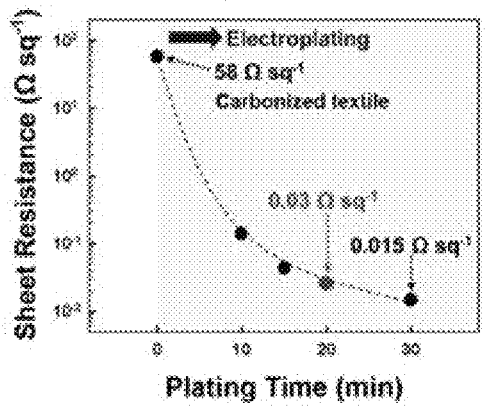
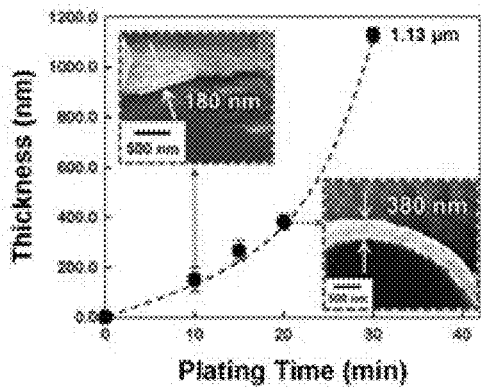

【FIG. 4】
* electroplating
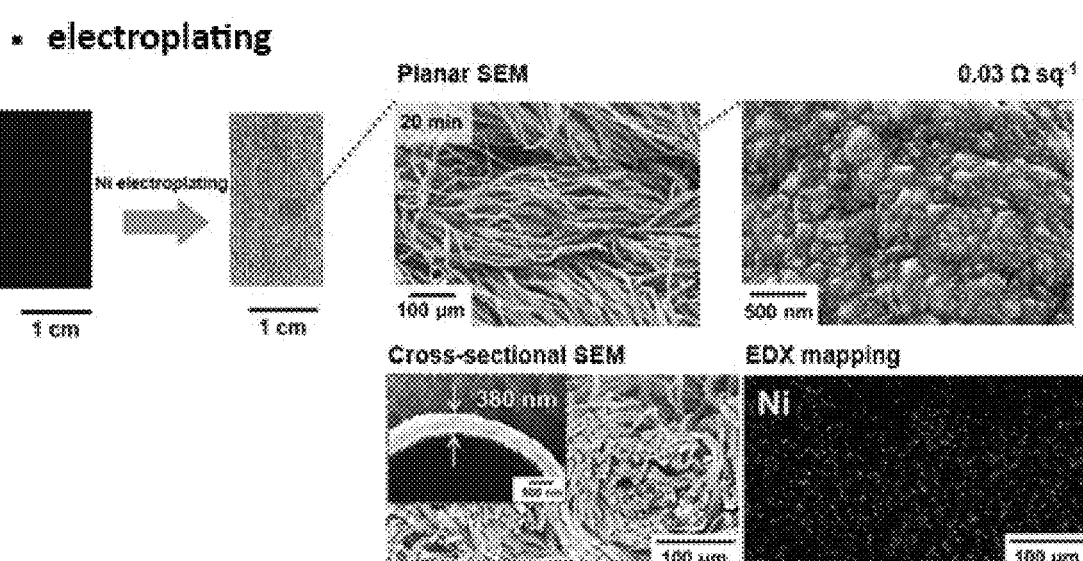
【FIG. 5】
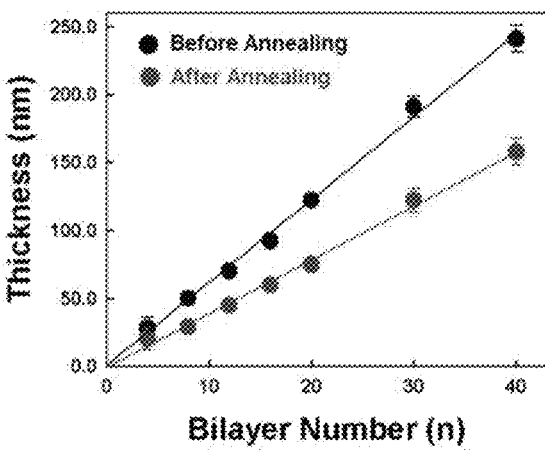
✓ Si wafer/(PEI/TALH)$_n$
✓ Annealing: N$_2$ gas (2 h), O$_2$ gas (4 h) at 450 °C
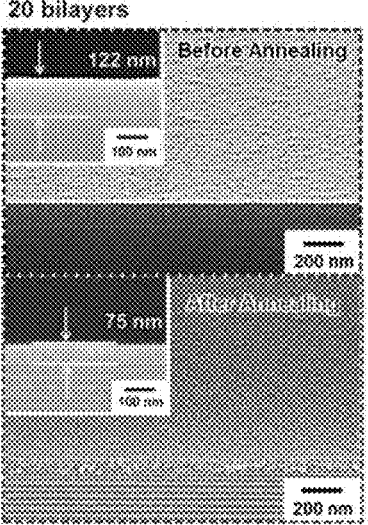

【FIG. 6】
【FIG. 7】
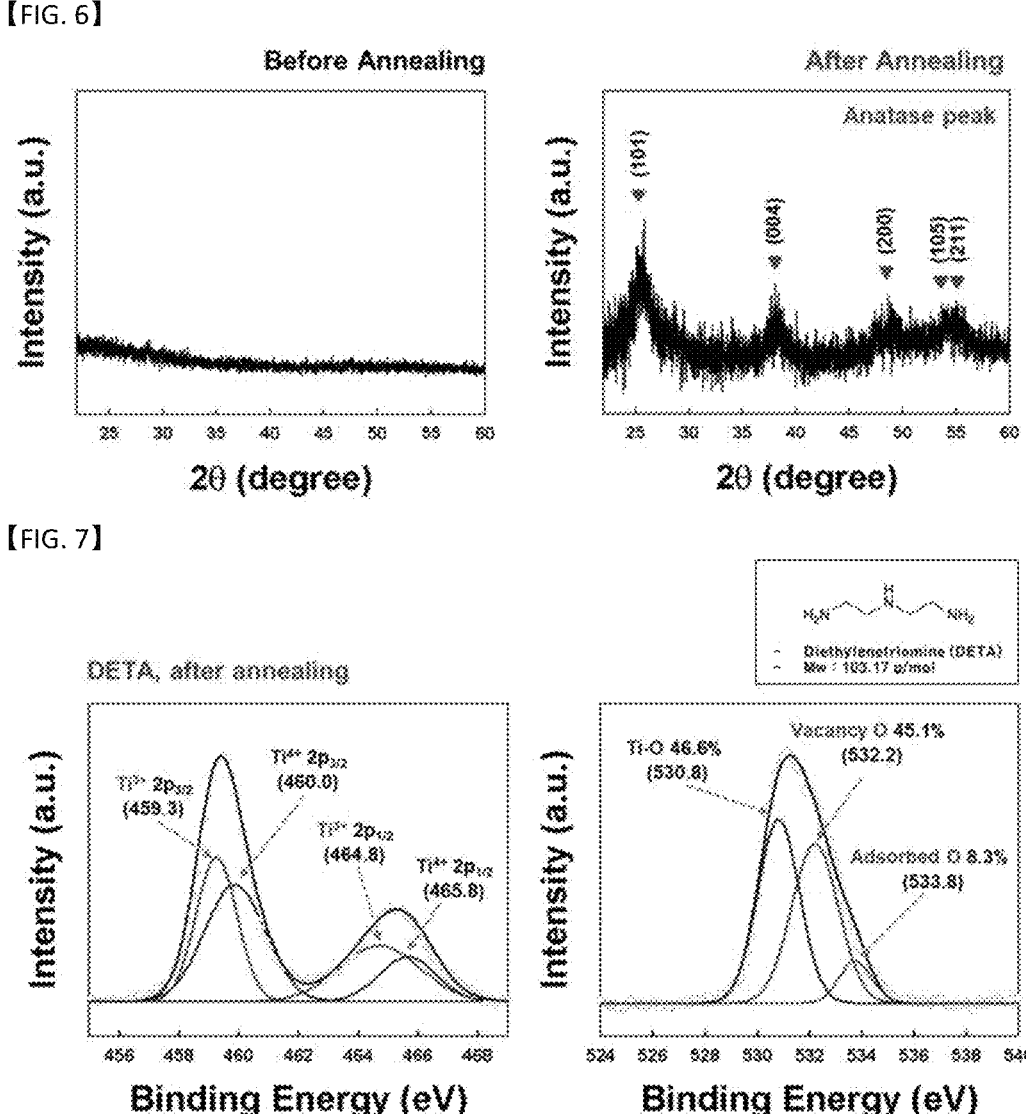

【FIG. 8】
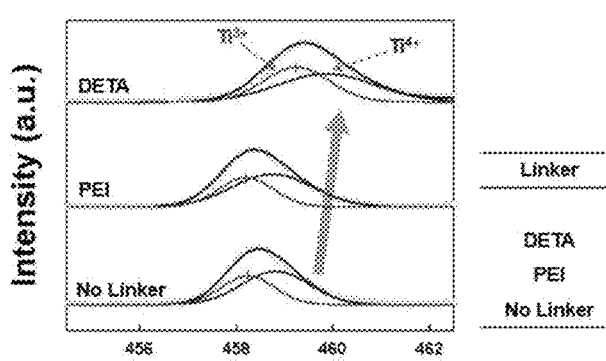
【FIG. 9】
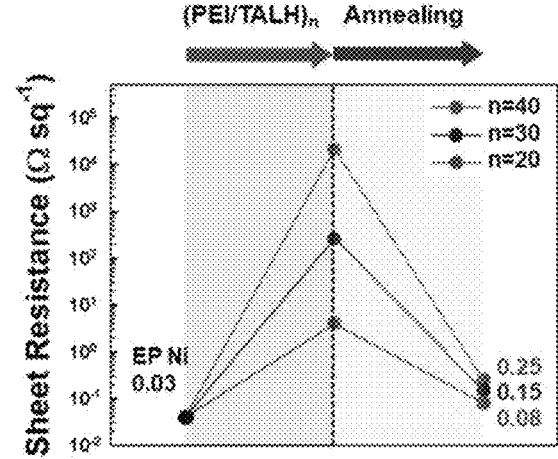
【FIG. 10】
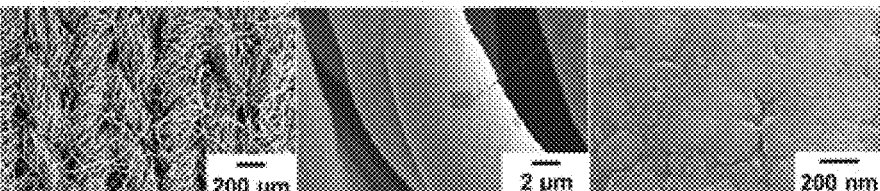
✓ Carbonized Cotton Fiber (PEI/TALH)₂₀ Before Annealing
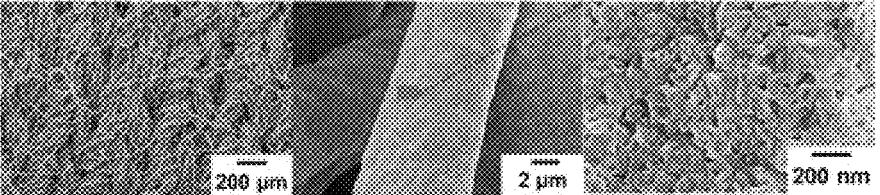
✓ Carbonized Cotton Fiber/Ni/TiOₓ After Annealing 【FIG. 11】
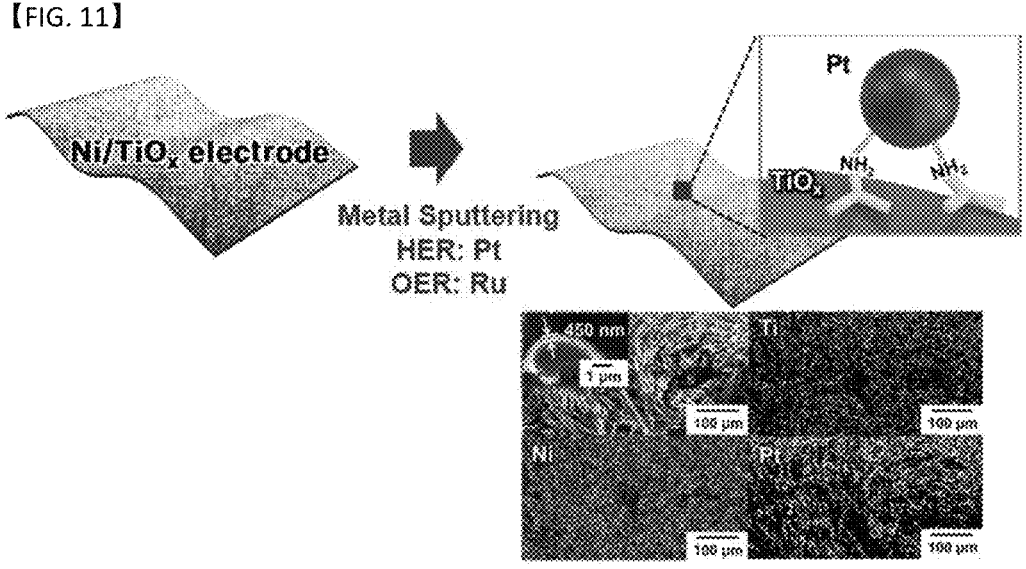
【FIG. 12】
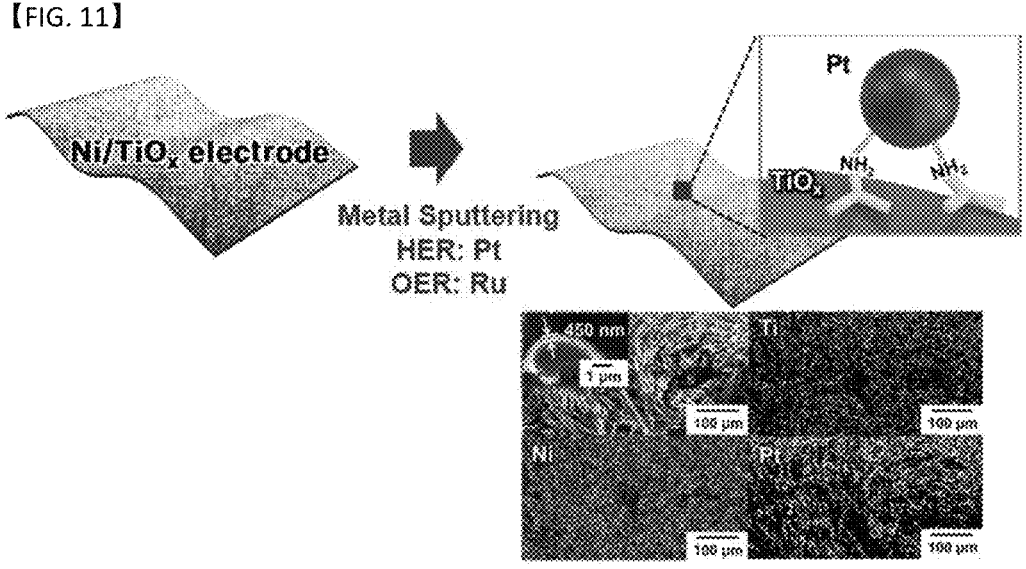

【FIG. 13】
Catalytic properties: oxygen generation reaction
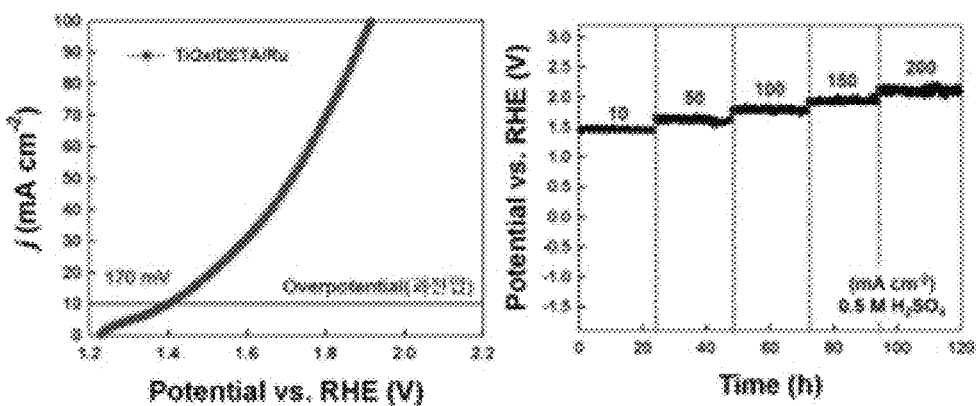
【FIG. 14】
• TiOx coating based on sol-gel method
Planar SEM
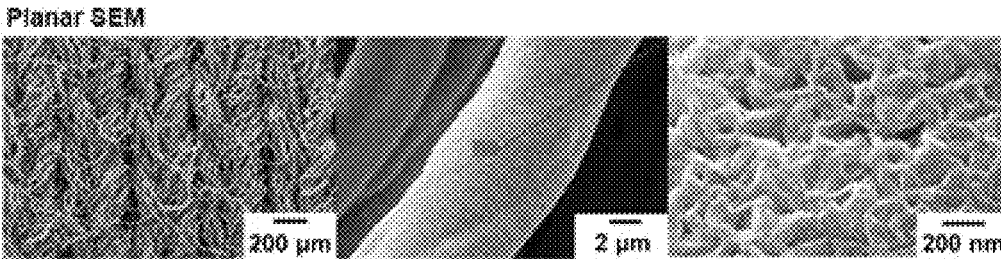
Cross-sectional SEM
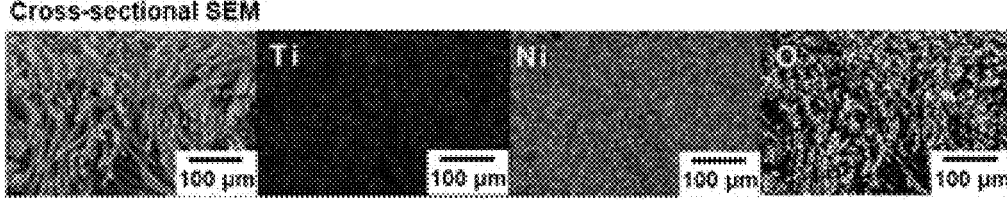

【FIG. 15】
* TiOx coating based on sol-gel method
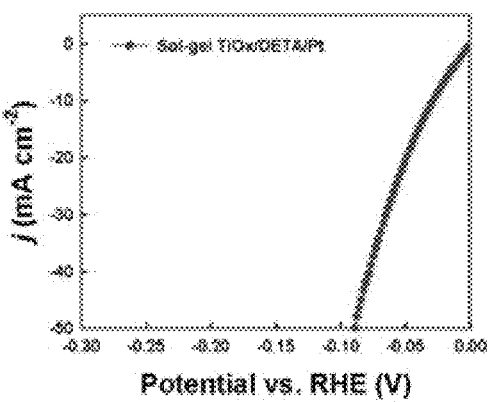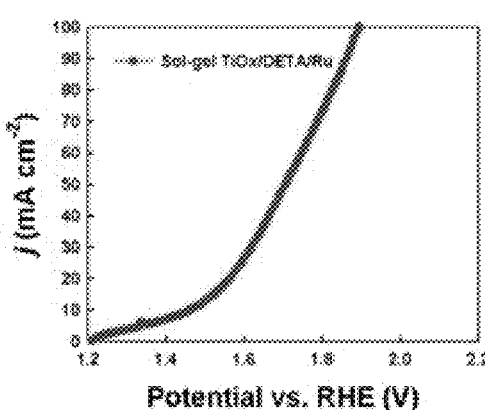

FABRIC-TYPE TITANIUM OXIDE-BASED POROUS WATER ELECTROLYSIS ELECTRODE AND METHOD FOR MANUFACTURING THE SAME, AND WATER ELECTROLYSIS DEVICE COMPRISING THE SAME

CROSS-REFERENCE TO RELATED APPLICATION

This application claims the benefit under 35 USC 119(a) of Korean Patent Application No. 10-2023-0058305, filed with the Korean Intellectual Property Office on May 4, 2023, the disclosure of which is incorporated herein by reference in its entirety.

TECHNICAL FIELD

The present invention relates to a fabric-type titanium oxide (TiOx)-based porous water electrolysis electrode, a method for manufacturing the same, and a water electrolysis device comprising the same.

BACKGROUND ART

With the industrial development, the use of fossil fuels is increasing, and the increasing generation of carbon dioxide is causing serious environmental problems. As a result, much research is being done around the world to develop energy to replace the use of fossil fuels, and interest in hydrogen energy is surging, with various countries and groups announcing roadmaps for hydrogen development. Hydrogen is being touted as the next generation of energy because it does not emit toxic gases when used as a fuel and has a high energy-to-weight ratio. Reforming is the most popular method for making hydrogen, but it requires high temperatures, high pressures, and emits carbon dioxide to produce hydrogen, which has led many researchers to focus on efficient water electrolysis.

A water electrolysis catalyst must have a high performance of not only hydrogen evolution reaction catalyst but also oxygen evolution reaction catalyst in the same electrolyte to expect a high performance of overall water electrolysis. In addition, the decomposition of water causes intermediates to adhere to the catalyst surface and fall off repeatedly, which represents the catalyst activation energy, so the provision of abundant active sites and rapid charge transfer on the catalyst surface are important factors for efficient hydrogen production.

Water electrolysis methods can be broadly categorized into alkaline water electrolysis using alkaline electrolyte and polymer electrolyte membrane (PEM) water electrolysis using acidic electrolyte. Among them, PEM electrolysis has high hydrogen production efficiency and can be operated at high current density due to its high ionic conductivity, but the durability of the catalyst and electrode is considered a problem because it operates in an acidic environment.

Carbon cloth and porous titanium (fiber, mesh) are commonly used as electrode supports, but carbon materials are difficult to use for cathodes that require high voltages because carbon corrosion occurs at 0.2 V or higher, which generates $CO_2$, and porous titanium is more durable in acidic conditions but has the disadvantage of being expensive.

In addition, due to the strongly acidic conditions, precious metal catalysts are used, so it is necessary to minimize their usage by immersing the catalyst in a support with a large surface area. However, there are limitations in securing a support material that is stable to high voltage and acidic environments and coating the catalyst to achieve good water electrolysis performance.

Although research has been conducted to develop water electrolysis electrodes based on fabric type, previously reported technologies have several limitations, such as reducing efficiency by adding a large amount of insulating polymer to coat the catalyst on a support, or blocking the porosity of the fabric material by thickly coating the precious metal catalyst. Therefore, the development of a process that can efficiently manufacture and control electrodes, as well as the development of catalysts and manufacturing methods that can expect high electrical characteristics and water electrolysis performance, are required.

Accordingly, the present inventors made diligent efforts to solve the above problems, imparting conductivity to the fabric material through a simple carbonization process and electroplating, and uniformly coating the titanium oxide layer through layer-by-layer assembly, etc. As a result, the present inventors have developed electrodes with excellent stability in strong acidic environments and completed the present invention by analyzing their characteristics.

DETAILED DESCRIPTION

Technical Problem

The present invention provides a fabric-type titanium oxide (TiOx)-based porous water electrolysis electrode, a manufacturing method thereof, and a water electrolysis device comprising the same.

However, the technical challenges of the present invention are not limited to those mentioned above, and other challenges not mentioned will be apparent to those skilled in the art from the following description.

Technical Solution

The present invention provides a method for manufacturing a water electrolysis electrode, comprising the steps of preparing a conductive support by heat treating a porous fabric type to carbonize it and then electroplating it (Step A); coating a titanium oxide layer on the conductive support followed by modifying the surface with an amine ($-NH_2$) material (Step B); and introducing a water electrolysis catalyst thereafter (Step C).

The fabric material may comprise one or more fabrics selected from the group consisting of cotton fibers, silk fibers, cellulose, polyester, nylon, acrylic fibers, and polyacrylonitrile fibers.

The carbonization may be performed by a low temperature carbonization process.

The electroplating may be performed by coating the conductive material.

The conductive material may comprise one or more selected from the group consisting of Ni, Cu, and Al.

In step A above, the porous structure of the fabric material may be maintained after electroplating.

In step B above, the titanium oxide layer may be coated by a layer-by-layer assembly or sol-gel method.

The amine ($-NH_2$) material above may comprise one or more selected from the group consisting of diethylenetriamine (DETA), tris(2-aminoethyl)amine, polyethylenimine, polyallylamine and hydrazine.

In step C above, the metal catalyst may be introduced by a sputtering method as a water electrolysis catalyst. Here, the metal catalyst may be Pt and Ru, and the introduction of Pt and Ru may improve the hydrogen evolution reaction performance and oxygen evolution reaction performance, respectively.

In step C above, the covalent bonding of the metal catalyst with the amine (—NH$_2$) material on the surface of the titanium oxide can be induced to impart the stability of the electrode.

The present invention also provides a porous water electrolysis electrode comprising a conductive support obtained by electroplating a porous fabric type after carbonization; a titanium oxide layer formed on the conductive support; and a metal catalyst layer formed on the titanium oxide layer, wherein the surface of the titanium oxide layer is modified with an amine (—NH$_2$) material.

The amine (—NH$_2$) material on the surface of the titanium oxide layer can form a covalent bond with the metal catalyst.

The present invention also provides a water electrolysis device comprising a porous water electrolysis electrode.

Advantageous Effects

According to the present invention, an electrode having a titanium oxide layer on a fabric material can be manufactured, and the durability of the electrode can be secured by using titanium oxide. Furthermore, a large surface area can be provided by the fabric material.

In addition, the electrode according to the present invention has excellent charge transport and a large surface area, which makes it easy for the generated hydrogen and oxygen to escape and for the electrolyte to penetrate, and thus has excellent performance with high efficiency.

Furthermore, the electrodes manufactured according to the present invention can have excellent drive stability due to the stable chemical bonding by the organic compounds designed at the interface of the collector and the catalyst.

In addition, the oxygen vacancies of the electrode can be controlled through surface modification of the titanium oxide, and the surface modification can maximize charge transfer and maximize the active area for hydrogen/oxygen evolution reaction.

Furthermore, the method of the present invention has the advantage of being a simple solution process and does not limit the size or shape of the electrodes to be manufactured.

DESCRIPTION OF DRAWINGS

FIG. 1 schematically illustrates a method for manufacturing electrodes according to the present invention.

FIG. 2 is a scanning electron microscope (SEM) image of a fabric type and a carbonized fiber that has undergone a low-temperature carbonization process on the fabric type.

FIG. 3 shows the surface resistivity characteristics and Ni thickness variation characteristics as a function of Ni electroplating time.

FIG. 4 is a scanning electron microscopy (SEM) image of the fabric material after Ni electroplating.

FIGS. 5 to 10 show the characterization of a titanium oxide layer coating process based on layer-by-layer assembly.

FIG. 11 schematically shows the water electrolysis catalyst introduction process.

FIG. 12 shows an analysis of the hydrogen evolution reaction after the electrolysis catalyst introduction process.

FIG. 13 shows an analysis of the oxygen evolution reaction after the water electrolysis catalyst introduction process.

FIG. 14 is an image of a titanium oxide layer coated by sol-gel method and analyzed by scanning electron microscopy (SEM).

FIG. 15 analyzes the hydrogen and oxygen evolution reaction performance of a water electrolysis electrode manufactured by coating a titanium oxide layer with sol-gel method.

MODE OF THE INVENTION

Generally, acidic water electrolysis electrodes are made of carbon cloth or porous titanium, but carbon materials are difficult to use as conductors due to carbon corrosion phenomenon, and porous titanium is expensive and limited in terms of large surface area. Therefore, there is a need for a high-efficiency and durable water electrolysis electrode manufacturing technology that minimizes the use of titanium and does not produce side reactions and corrosion in acidic solutions.

As a result of the inventors' diligent efforts to solve the problems of the prior art, the present invention was completed by making the fabric material conductive by a simple carbonization process and electroplating, uniformly coating a layer(s) of titanium oxide through a layer-by-layer assembly or sol-gel method to produce an electrode with excellent stability in a strong acidic environment, and characterizing it.

The present invention provides a method for manufacturing a water electrolysis electrode, comprising the steps of heat treating a porous fabric type to carbonize it and then electroplating it to produce a conductive support (Step A); coating a titanium oxide layer on the conductive support and then modifying the surface with an amine material (Step B); and subsequently introducing a water electrolysis catalyst (Step C).

According to the present invention, an electrode having excellent performance (high efficiency and high durability) in an acidic environment can be prepared by forming a conductive support by carbonization process and electroplating on a porous fabric material, and coating a titanium oxide layer and a metal catalyst layer on this support.

Step A: Preparing the Conductive Support

The fabric material may comprise one or more fabrics selected from the group consisting of cotton fibers, silk fibers, cellulose, polyester, nylon, acrylic fibers, and polyacrylonitrile fibers.

The carbonization may be performed by a low temperature carbonization process. In particular, a low temperature carbonization process may be applied to the insulating fabric type to impart a minimum conductivity to the plating.

The heat treatment of the porous fabric type may be carried out at 450° C. to 1500° C., more preferably at 650° C. to 1000° C.

The carbonization process at the above temperatures can impart conductivity for electroplating.

To ensure the conductivity of the electrolysis electrode, electroplating is performed on the carbonized fabric type, and the electroplating can be performed by coating a conductive material.

The conductive material may comprise one or more selected from the group consisting of Ni, Cu and Al, and more preferably Ni.

When electroplating according to this process, the coating can be applied uniformly without blocking the porous structure of the fabric material.

Through this process, a conductor with a sheet resistance of 0.1 to 0.001 $\Omega$sq$^{-1}$ can be obtained. This range is comparable to the electrical conductivity of bulk metals, indicating that the process is well suited for metallization of insulating fabric type.

Step b: Coating the Titanium Oxide Layer

The titanium oxide layer can be coated by layer-by-layer assembly or sol-gel method. The coating of the titanium oxide layer ensures the durability of the electrode.

The surface of the titanium oxide layer can be surface modified by an amine material. The surface modification can maximize the charge transfer and maximize the active area for hydrogen/oxygen evolution reaction.

The amine material may comprise one or more selected from the group consisting of amine group-based materials, such as diethylenetriamine (DETA), tris(2-aminoethyl) amine, polyethylenimine, polyallylamine and hydrazine.

Step C: Introducing a Water Electrolysis Catalyst

A water electrolysis catalyst(s) can be introduced by coating the electrode surface with a metal catalyst through a sputtering method.

Specifically, hydrogen-generating and oxygen-generating catalysts can be introduced by coating Pt and Ru, respectively.

This process induces a covalent bond between the metal catalyst and the amine material on the surface of the titanium oxide, thus ensuring the stability of the electrode.

The present invention may also provide a porous water electrolysis electrode comprising: a conductive support obtained by electroplating a porous fabric material after carbonization; a titanium oxide layer formed on the conductive support; and a metal catalyst layer formed on the titanium oxide layer, wherein the titanium oxide layer is characterized in that its surface is modified by an amine material. The amine material on the surface of the titanium oxide layer can form a covalent bond with the metal catalyst.

The present invention may also provide a water electrolysis device comprising the water electrolysis electrode.

Hereinafter, the present invention will be described in more detail through examples. The purpose, features, and advantages of the present invention will be easily understood through the following examples. The present invention is not limited to the embodiments described herein and may be embodied in other forms. The embodiments introduced here are provided to enable the idea of the present invention to be sufficiently conveyed to those skilled in the art to which the present invention pertains. Therefore, the present invention should not be limited by the following examples.

Example 1. Preparation of a Water Electrolysis Electrode 1

1-1: Preparation of Conductive Support

A cotton fabric having a width of about 14.6 $\mu$m and a thickness of about 790 $\mu$m was purchased from Cotton Day (Korea). The cotton fabric was subjected to a heat treatment process at 950° C. under an argon atmosphere for 3 hours, and then electroplating was performed in a plating solution (nickel plating solution of Watt bath composition). Afterward, it was washed in distilled water and dried at room temperature to prepare the conductive support.

1-2: Formation of the Titanium Oxide Layer

A titanium oxide layer was formed on the conductive support prepared according to Example 1-1 using a layer-by-layer assembly method based on electrostatic attraction.

Specifically, PEI (Polyethyleneimine) and TALH (Titanium(IV)bis(ammonium lactate)dihydroxide) are cross-laminated to form a (PEI/TALH)n layer. The PEI solution has a (+) charge and the TALH solution has a (−) charge, which can be electrostatically attracted to each other. The (PEI/TALH)n layer was then heat treated at 450° C. for 2 h in $N_2$ atmosphere and 4 h in $O_2$ atmosphere to form a titanium oxide layer.

1-3: Electrode Surface Modification

A titanium oxide layer was formed on the conductive support as shown in Example 1-2, and then the electrode surface was modified with an amine material.

Specifically, a support with a titanium oxide layer was immersed in a solution of diethylenetriamine dissolved in ethanol. The diethylenetriamine and titanium can be combined through chemical bonding.

1-4: Preparation of Porous Water Electrolysis Electrode

After performing the electrode surface modification according to Example 1-3 above, hydrogen evolution reaction performance and oxygen evolution reaction performance were improved by coating Pt and Ru by sputtering method, respectively, to prepare porous hydrogen and oxygen evolution reaction electrode.

Specifically, metal sputtering is performed at 20 mA for 50 seconds back and forth across the sample for a total of 100 seconds.

Example 2. Preparation of Water Electrolysis Electrodes 2

The same method as Example 1 was applied, but a porous water electrolysis electrode was manufactured by coating the titanium oxide layer using a simple sol-gel method instead of the layer-by-layer assembly method.

Specifically, the sol-gel method used a solution of 2 g of Titanium butoxide, 0.14 g of HCl, and 10 g of Isopropyl Alcohol to soak the conductive support. Each dip was performed for 30 minutes, and the number of dips may vary depending on the type of fabric. The subsequent process was the same as in Example 1.

Experimental Example 1. Analysis of Carbonization Process Characteristics

The porous fabric type and the carbonized fibers subjected to the heat treatment process of Example 1-1 were analyzed by scanning electron microscopy (SEM) images, and the results were shown in FIG. 2.

The present invention is characterized in that it does not impart conductivity to the fiber by heat treatment itself, but rather imparts the minimum conductivity possible by plating through a low-temperature carbonization process, and has the advantage that the porosity of the fabric type remains unchanged even after the low-temperature carbonization process, making it possible to produce a support with a large surface area.

As shown in FIG. 2, it was found that the porous structure of the fabric material was maintained after the carbonization process, and the area was reduced by about 57% and the volume by about 43% due to the decomposition of organic matter.

Experimental Example 2. Analysis of Ni Electroplating Characteristics

Ni electroplating was performed on the fabric material that was subjected to the carbonization process of Example 1-1, and the sheet resistance characteristics and thickness changes of the fabric material strands with increasing plating time were analyzed.

As shown in FIG. 3, it was found that the sheet resistance decreased as the plating time increased. It was also observed that Ni grew in uniform thickness on the strands of the fabric material.

Furthermore, as shown in FIG. 4, it was found that when Ni electroplating is performed on the fabric type by the method of Example 1, the coating was uniformly applied without blocking the porous structure of the fabric material. The conductor obtained according to the process of Example 1 was found to have a final 0.03 $\Omega sq^{-1}$ area resistivity.

Experimental Example 3. Analysis of Titanium
Oxide Layer Coating Characteristics The properties according to the titanium oxide layer coating process based on the layer-by-layer assembly of Example 1-3 above were analyzed, and the results were shown in FIGS. 5 to 10.

Referring to FIG. 5, alternating deposition of amine polymer (PEI) and titanium precursor (TALH) was performed, and it was found that the film was grown uniformly. After annealing, the thickness of the film decreased by about 40%, indicating that TiOx was formed through this process.

Referring to FIG. 6, XRD data analysis confirmed that TiOx formed an anatase peak after the annealing process.

Referring to FIG. 7, it was confirmed through XPS analysis that when the titanium oxide surface was treated with an amine material (diethyleneteramine: DETA), $Ti^{3+}$ was predominantly generated and Vacancy O was formed at 45.1%.

Referring to FIG. 8, when the titanium oxide surface was modified with an amine, the Ti 2p peak was shifted to the right, and Vacancy O was analyzed as the highest, and these XPS analysis results indicated that the surface modification by the amine enhanced the charge transfer of the electrode.

Referring to FIG. 9, in accordance with one embodiment of the present invention, a porous Ni support was coated with an amine polymer and a titanium precursor via layer-by-layer assembly, and the conductivity of the electrode was achieved by annealing.

Referring to FIG. 10, it was found that the porous structure of the fabric material was retained after the titanium oxide was coated on the strand surface, in accordance with one embodiment of the present invention. Furthermore, after annealing, the surface of the strands formed a corrugated structure, which provides a large specific surface area of the electrode, which can lead to an improvement in water electrolysis performance.

Experimental Example 4. Analysis of Water
Electrolysis Catalyst Characteristics

Referring to FIG. 11, the water electrolysis catalyst was introduced by the sputtering method according to Example 1-4 above, and covalent bonding was induced between the metal catalyst and the amine material on the surface of the titanium oxide to ensure the stability of the electrode. Furthermore, cross-sectional SEM analysis confirmed that the titanium oxide layer and the Pt catalyst were coated to the inside.

Referring to FIG. 12, the hydrogen evolution reaction was checked, and it showed excellent hydrogen evolution performance under the influence of amine materials. It was also confirmed that the stable bonding of the electrode and the metal catalyst resulted in excellent operation stability even in harsh acidic solutions.

Referring to FIG. 13, as a result of confirming the oxygen evolution reaction by coating Ru on the electrode surface, it was confirmed that it had excellent oxygen evolution performance and excellent operational stability.

Experimental Example 5. Analysis of Titanium
Oxide Layer Coating Characteristics Based on
Sol-Gel Method Referring to FIG. 14, the titanium oxide layer was coated by a simple sol-gel method instead of the layer-by-layer assembly method according to Example 2 above, and SEM image analysis confirmed that the titanium oxide layer was uniformly coated.

Referring to FIG. 15, the hydrogen and oxygen evolution reaction performance of the electrodes prepared by sol-gel method was also found to be excellent.

The invention claimed is:

1. A method of manufacturing a water electrolysis electrode comprising:
    preparing a conductive support by heat treating a porous fabric to carbonize it and then electroplating it (Step A);
    coating a titanium oxide layer on the conductive support followed by modifying the surface with an amine material (Step B); and
    introducing a water electrolysis catalyst thereafter (Step C).

2. The method of manufacturing a water electrolysis electrode according to claim 1, wherein the fabric comprises at least one fabric selected from the group consisting of cotton fibers, silk fibers, cellulose, polyester, nylon, acrylic fibers, and polyacrylonitrile fibers.

3. The method of manufacturing a water electrolysis electrode according to claim 1, wherein the carbonization is performed by a low temperature carbonization process.

4. The method of manufacturing a water electrolysis electrode according to claim 1, wherein the heat treatment is performed at 450° C. to 1500° C.

5. The method of manufacturing a water electrolysis electrode according to claim 1, wherein the electroplating is performed by coating a conductive material.

6. The method of manufacturing a water electrolysis electrode according to claim 5, wherein the conductive material comprises at least one selected from the group consisting of Ni, Cu, and Al.

7. The method of manufacturing a water electrolysis electrode according to claim 1, wherein a conductor having a sheet resistance of 0.1 to 0.001 $\Omega sq^{-1}$ is obtained by the process of the Step A.

8. The method of manufacturing a water electrolysis electrode according to claim 1, wherein the porous structure of the fabric is maintained after electroplating.

9. The method of manufacturing a water electrolysis electrode according to claim 1, wherein the Step B is characterized by coating a titanium oxide layer by a layer-by-layer assembly or sol-gel method.

10. The method of manufacturing a water electrolysis electrode according to claim 1, wherein the amine material comprises at least one selected from the group consisting of diethylenetriamine (DETA), tris(2-aminoethyl)amine, polyethylenimine, polyallylamine and hydrazine.

11. The method of manufacturing a water electrolysis electrode according to claim 1, wherein the step C comprises introducing a metal catalyst as a water electrolysis catalyst by a sputtering method.

12. The method of manufacturing a water electrolysis electrode according to claim 11, wherein the step C induces covalent bonding of the metal catalyst and the amine material on the surface of the titanium oxide to impart stability to the electrode.

13. A water electrolysis electrode comprising a conductive support obtained by carbonizing a porous fabric followed by electroplating;

a titanium oxide layer formed on the conductive support; and a metal catalyst layer formed on the titanium oxide layer, wherein the titanium oxide layer has a surface modified with an amine material, and wherein the amine material on the surface of the titanium oxide layer forms a covalent bond with the metal catalyst.

14. A water electrolysis device comprising the water electrolysis electrode of claim 13.

* * * * *